United States Patent [19]
Kamiyama

[11] Patent Number: 5,770,525
[45] Date of Patent: Jun. 23, 1998

[54] METHOD OF FABRICATING SEMICONDUCTOR DEVICE AND METHOD OF FABRICATING HIGH-FREQUENCY SEMICONDUCTOR DEVICE

[75] Inventor: Tomoyuki Kamiyama, Saitama-ken, Japan

[73] Assignee: Honda Giken Kogyo Kabushiki Kaisha, Tokyo, Japan

[21] Appl. No.: 558,548

[22] Filed: Nov. 16, 1995

[30] Foreign Application Priority Data

Nov. 18, 1994 [JP] Japan .................................. 6-285669
Aug. 7, 1995 [JP] Japan .................................. 7-201145

[51] Int. Cl.⁶ .................................................. H01L 21/302
[52] U.S. Cl. ........................ 438/745; 438/172; 438/576; 438/589; 216/83
[58] Field of Search .................. 437/40 RG, 40 GS, 437/40 LC, 41 GS, 41 RG, 184, 192, 203; 216/83

[56] References Cited

U.S. PATENT DOCUMENTS 5,279,704  1/1994  Saito .
5,362,683  11/1994  Takenaka et al. ....................... 437/226

FOREIGN PATENT DOCUMENTS 63-062235  3/1988  Japan .
6-029322   2/1994  Japan .
6-104287   4/1994  Japan .

*Primary Examiner*—Trung Dang
*Attorney, Agent, or Firm*—Lyon & Lyon LLP

[57] ABSTRACT

A superlattice buffer layer, an AlGaAs layer, an InGaAs layer, an AlGaAs layer, and an N+GaAs layer are successively deposited on a GaAs layer by epitaxial growth. Using an electron-beam resist as a mask, a patterning layer in the form of an SiO2 film is formed on the N+GaAs layer. Then, only the N+GaAs layer is selectively etched through an opening in the electron-beam resist with a water-diluted etchant which comprises a mixture of ammonia water and hydrogen peroxide solution which are mixed at a ratio of at least 1:4000, thereby forming a recess in the N+GaAs layer. Using the electron-beam resist also as a mask, a gate metal member serving as the base end of a T-shaped gate electrode is deposited on the AlGaAs layer in the recess. The width of an opening in the electron-beam resist determines the gate length.

15 Claims, 6 Drawing Sheets

METHOD OF FABRICATING SEMICONDUCTOR DEVICE AND METHOD OF FABRICATING HIGH-FREQUENCY SEMICONDUCTOR DEVICE

BACKGROUND OF THE INVENTION

1. Field of the Invention

The present invention relates to a method of fabricating a semiconductor device having a heterojunction structure between an AlGaAs layer and a GaAs layer, and more particularly to a method of fabricating a semiconductor device such as a field-effect transistor, especially a high-frequency semiconductor device suitable for use in a high-frequency range from about 60 GHz to 100 GHz.

1. Description of the Prior Art

Japanese laid-open patent publication No. 63-62235 discloses a process of selectively etching a GaAs layer with an aqueous solution (etchant) which contains ammonia water (containing 28% by weight of ammonia) and hydrogen peroxide solution (containing 30% by weight of hydrogen peroxide) that are mixed with each other at a ratio ranging from 1:750 to 1:1500, for the fabrication of a semiconductor device having a GaAs layer and an AlGaAs mixed-crystal layer.

Various processes of forming a gate electrode of T-shaped cross section are shown in Japanese laid-open patent publications Nos. 6-29322 and 6-104287.

In a field-effect transistor having a GaAs layer disposed on an AlGaAs layer, the GaAs layer is selectively etched to form a recess, and a metal gate electrode is evaporated on the AlGaAs layer. However, the selective etching process tends to remove also a portion of the AlGaAs layer, causing the gate threshold voltage of the field-effect transistor to vary or resulting in undesirable normally-off characteristics.

Particularly, if the composition ratio of Al in the AlGaAs layer is smaller than 0.3, then it is difficult to selectively etch only the GaAs layer with the etchant containing ammonia water and hydrogen peroxide solution that are mixed with each other at a ratio ranging from 1:750 to 1:1500.

Furthermore, since a patterning layer having a small opening width is used in etching the GaAs layer beneath the patterning layer, the etchant may possibly fail to enter the pattern opening sufficiently. In the event that the etchant does not fully enter the pattern opening, the GaAs layer cannot selectively be etched desirably.

SUMMARY OF THE INVENTION

It is therefore an object of the present invention to provide a method of fabricating a semiconductor device using a patterning layer which has a small opening width of 0.5 mm or smaller according to a selective etching process with high selectivity for forming a recess and a gate electrode.

According to the present invention, there is provided a method of fabricating a semiconductor device having a heterojunction structure between an AlGaAs layer and a GaAs layer disposed thereon, comprising the steps of forming a resist having an opening which has a width of at most 0.5 mm on the GaAs layer, selectively etching only the GaAs layer through said opening with an etchant which comprises a mixture of ammonia water and hydrogen peroxide solution which are mixed at a ratio of at least 1:4000, said mixture being diluted with water, thereby to form a recess in said GaAs layer, and forming an electrode on the AlGaAs layer in said recess through said opening, using said resist as a mask. Before the GaAs layer is selectively etched, a surface-active agent may be applied to allow the etchant to enter easily into the opening. The opening may have a width of about 0.1 mm.

According to the present invention, there is also provided a method of fabricating a high-frequency semiconductor device having a heterojunction between an AlGaAs layer having a thickness of about 300 angstroms and a GaAs layer disposed adjacent thereto, comprising the step of selectively etching the GaAs layer with an etchant which comprises a mixture of ammonia water and hydrogen peroxide solution which are mixed at a ratio of at least 1:4000.

According to the present invention, there is further provided a method of fabricating a high-frequency semiconductor device having a heterojunction between an AlGaAs layer in which a mixed-crystal ratio of Al ranges from 0.2 to 0.3 and which has a thickness of about 300 angstroms and a GaAs layer disposed adjacent to the AlGaAs layer, comprising the step of selectively etching only the GaAs layer with an etchant which comprises a mixture of ammonia water and hydrogen peroxide solution which are mixed at a ratio of at least 1:4000.

According to the present invention, there is further provided a method of fabricating a high-frequency semiconductor device having a heterojunction between an AlGaAs layer and a GaAs layer, comprising the step of selectively etching only the GaAs layer with an etchant which comprises a mixture of ammonia water and hydrogen peroxide solution which are mixed at a ratio of at least 1:4000, the mixture being diluted with at least about six times its volume of water.

According to the present invention, there is also provided a method of fabricating a semiconductor device having a heterojunction structure between an AlGaAs layer and a GaAs layer disposed thereon, comprising the step of selectively etching only the GaAs layer with an etchant which comprises a mixture of ammonia water and hydrogen peroxide solution which are mixed at a ratio of at least 1:8000.

As described above, when an etchant which comprises a water-diluted mixture of ammonia water and hydrogen peroxide solution which are mixed at a ratio of at least 1:4000 is used, only the GaAs layer can selectively be etched to form a recess therein.

Since one patterning layer is used in forming the recess in the GaAs layer and also forming the electrode, e.g., a gate electrode, on the AlGaAs layer in the recess, the electrode is self-aligned with the recess. Inasmuch the electrode is prevented from being misaligned, it is possible to fabricate semiconductor devices of uniform characteristics according to the method of the present invention.

The application of a surface-active agent prior to the etching of the GaAs layer allows the etchant to enter easily into the opening in the patterning layer. Therefore, the GaAs layer can sufficiently be etched by the applied etchant. The method according to the present invention makes it possible to fabricate semiconductor devices having fine electrodes suitable for use in a high-frequency range.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENT

A method of fabricating a field-effect transistor according to the present invention will be described below with reference to FIGS. 1 through 12.

Figure 1:
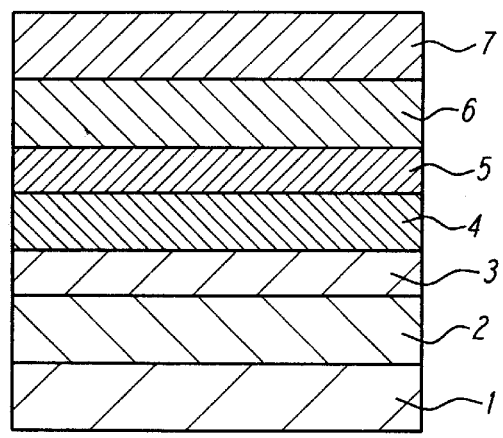
FIGS. 1 through 12 and 14 are cross-sectional views showing a method of fabricating a field-effect transistor according to the present invention.

As shown in FIG. 1, a superlattice buffer layer 2 is deposited on a gallium arsenide (GaAs) substrate 1, and then a double-hetero structure composed of an aluminum gallium arsenide (AlXGa1-XAs) layer 3 where the mixed-crystal ratio (X) of Al ranges from 0.2 to 0.3, an indium gallium arsenide (InGaAs) layer 4, and an AlGaAs layer 5 is deposited on the superlattice buffer layer 2. The AlGaAs layer 5 has a thickness of about 300 angstroms. Thereafter, an N+GaAs layer 6 is deposited on the AlGaAs layer 5. The N+GaAs layer 6 has a thickness of about 500 angstroms. On the nitrogen-doped gallium arsenide (N+GaAs) layer 6, there is deposited a silicon dioxide (SiO2) film 7 having a thickness of about 500 angstroms by a plasma chemical vapor deposition (CVD) apparatus. The SiO2 film 7 will subsequently serve as a mask in etching the N+GaAs layer 6 and also double as a spacer.

Figure 2:
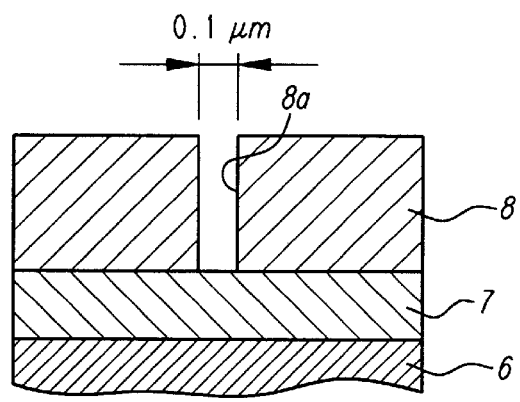

Then, as shown in FIG. 2, the SiO2 film 7 is covered with an electron-beam resist 8 having a thickness of 3000 angstroms, and a pattern having an opening 8a is formed in the electron-beam resist 8 by an electron-beam pattern generator. The opening 8a may have a width ranging from 0.1 mm to 0.5 mm. If the width of the opening 8a is 0.1 mm, then the field-effect transistor which will be fabricated according to this method is suitable for use in a high-frequency range from about 60 GHz to 100 GHz, preferably as a component in a radar device on an automobile. If the width of the opening 8a is 0.5 mm, then the field-effect transistor which will be fabricated according to this method is suitable for use in a lower-frequency range from about 1 GHz to 10 GHz, preferably as a component in a satellite communication system, a personal handy-phone system, etc. If the width of the opening 8a falls between 0.1 mm and 0.5 mm, then the field-effect transistor which will be fabricated according to this method is suitable for use in an intermediate-frequency range. In the illustrated embodiment, the width of the opening 8a is 0.1 mm.

Figure 3:
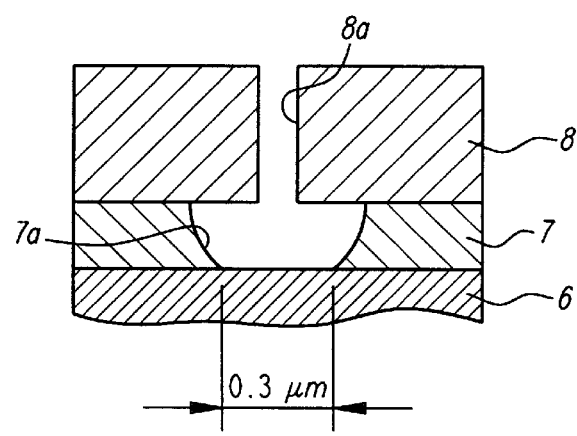

Using the patterned electron-beam resist 8 as a mask, the SiO2 film 7 is etched into a patterning layer having an opening 7a whose lower width is of about 3 mm as shown in FIG. 3. At this time, the SiO2 film 7 is etched by an etchant of buffered hydrofluoric acid (BHF) (HF:H2O:NH4F=1:10:10). Prior to the etching of the SiO2 film 7, a surface-active agent is preferably applied to pretreat the surface formed so far to allow the etchant to find its way effectively into the small pattern opening 8a in the electron-beam resist 8 for thereby facilitating the subsequent wet etching process through the pattern opening 8a.

Figure 4:
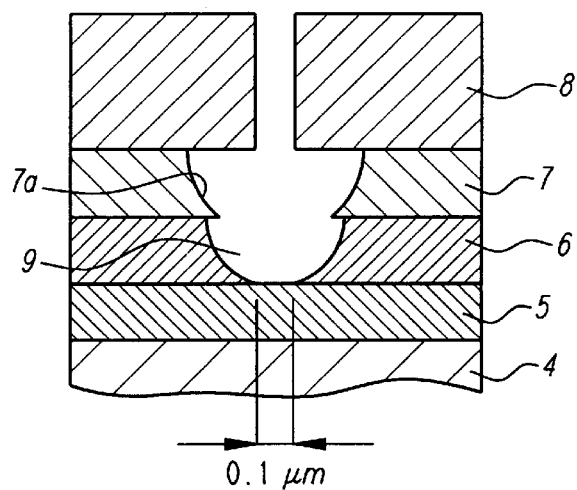

Then, as shown in FIG. 4, the N+GaAs layer 6 is etched for recess formation therein. Specifically, a surface-active agent is first applied to pretreat the surface formed so far to allow the etchant to find its way effectively into the pattern openings 8a, 7a in the electron-beam resist 8 and the SiO2 film 7. Thereafter, the N+GaAs layer 6 is selectively etched to form a recess 9 therein by an aqueous solution of ammonia water and hydrogen peroxide solution. The time in which the N+GaAs layer 6 is selectively etched, i.e., the etching time, is controlled to shape the recess 9 into a trapezoidal form having an upper opening width of 0.3 mm and a lower opening width of 0.1 mm. Therefore, the N+GaAs layer 6 is etched into a configuration which minimizes the area of the AlGaAs layer 5 that is exposed outwardly for supplying electrons to the channel of the field-effect transistor. The AlGaAs layer 5 with its minimum exposed area is stabilized, so that the field-effect transistor will generate reduced noise in operation. Furthermore, since the resistance between the channel and source and drain electrodes of the field-effect transistor is reduced, the mutual conductance of the field-effect transistor is increased.

Figure 5:
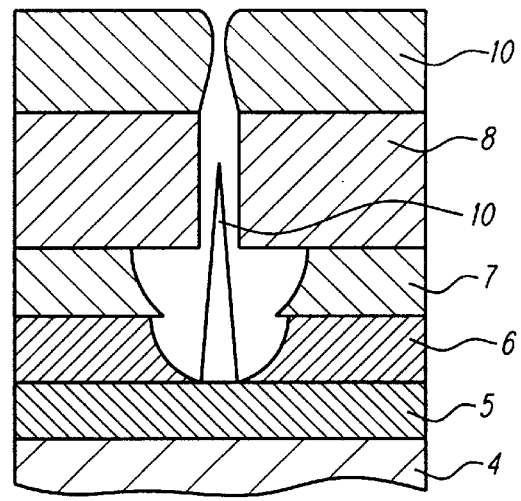

Thereafter, as shown in FIG. 5, using the electron-beam resist 8 as a mask, an upwardly pointed gate metal member 10 of titanium and gold (Ti/Au) is formed on the exposed area of the AlGaAs layer 5 in the pattern openings in the N+GaAs layer 6, the SiO2 film 7, and the electron-beam resist 8, and also a gate metal layer 10 of Ti/Au is deposited on the electron-beam resist 8 by a resistance-heating vacuum evaporation apparatus. Inasmuch as the gate metal member 10 is formed with the electron-beam resist 8 serving as a mask, the opening width of the electron-beam resist 8 determines the length of a gate electrode which will be formed.

Figure 6:
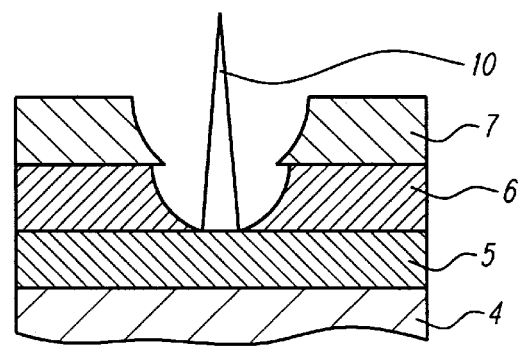

Then, the electron-beam resist 8 is lifted off to remove itself and the gate metal layer 10 thereon as shown in FIG. 6.

Figure 7:
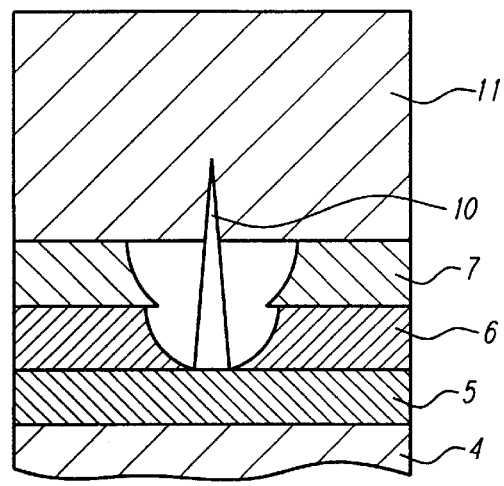
Figure 8:
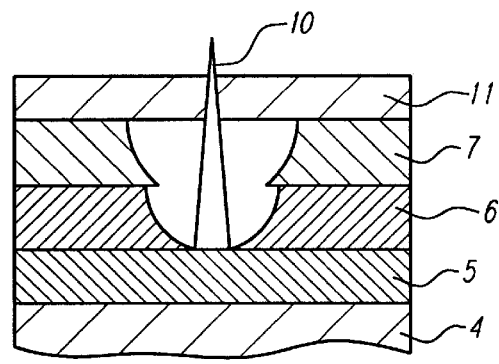

As shown in FIG. 7, a first resist 11 is coated on the SiO2 film 7 and the gate metal member 10. Thereafter, the first resist 11 is etched back with a gas of carbon tetrafluoride (CF4) and oxygen (O2) or the like by dry etching until the upwardly pointed end of the gate metal member 10 projects from the first resist 11, as shown in FIG. 8.

Figure 9:
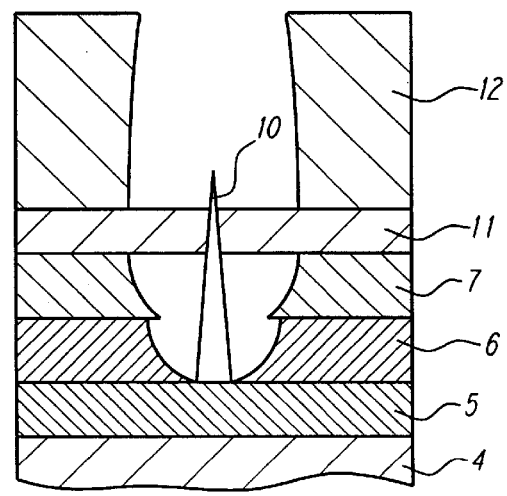

Thereafter, as shown in FIG. 9, a second resist 12 is coated on the first resist 11, producing a lift-off resist pattern.

Figure 10:
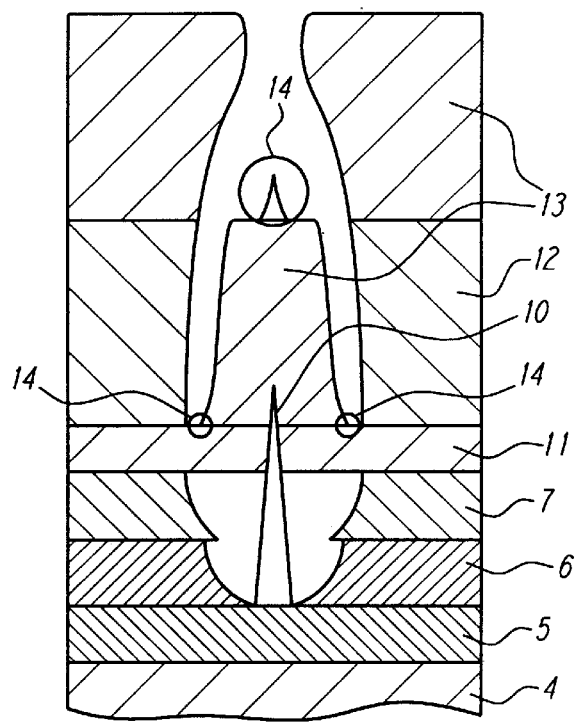

Then, as shown in FIG. 10, a gate metal member 13 of Ti/Au is evaporated on the first resist 11 and the projected end of the gate metal member 10 and a gate metal layer 13 of Ti/Au is evaporated on the second resist 12.

Figure 11:
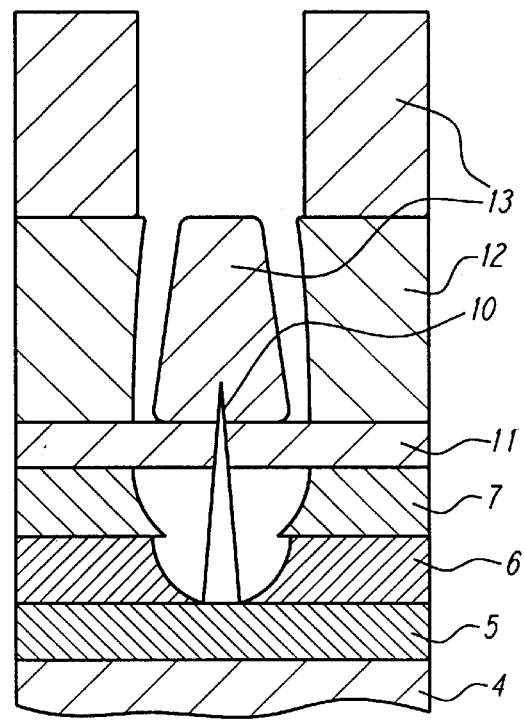

Whiskers 14 (see FIG. 10) are then removed from the gate metal member 13 on the first resist 11 by an etchant of potassium iodide (KI) and iodine (I2) (KI:I2:H2O= 100:50:300) and an aqueous solution of HF (HF:H2O= 1:100), as shown in FIG. 11, so that no electric field will be concentrated on any whiskers.

Figure 12:
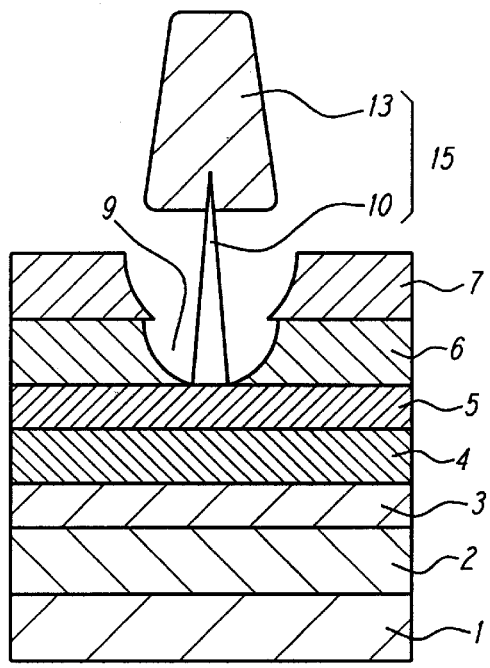
Figure 14:
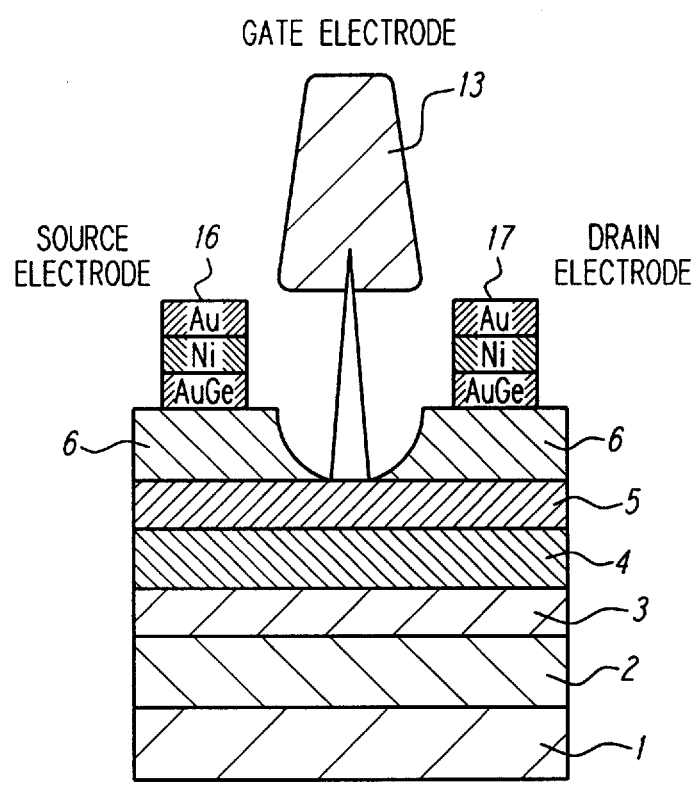

Thereafter, the first resist 11, the second resist 12, and the gate metal layer 13 are removed, thus producing a T-shaped gate electrode 15 composed of the gate metal member 10 and the gate metal member 13 as shown in FIG. 12. Then, source and drain electrodes are formed as seen in FIG. 14, whereupon a field-effect transistor is fabricated. FIG. 14 shows the cross-section of a double-hetero structure HEMT (namely, a pseudomorphic HEMT) which is made by the method of the present invention. A source electrode 16 and a drain electrode 17, each having a three-layer structure, are each deposited on N+GaAs layer 6 by the vacuum evaporation method. Between the N+GaAs layer 6 and the source electrode 16 is formed with ohmic contact by thermal annealing. Between the N+GaAs layer 6 and the drain electrode 17 is formed with ohmic contact by thermal annealing.

Figure 13:
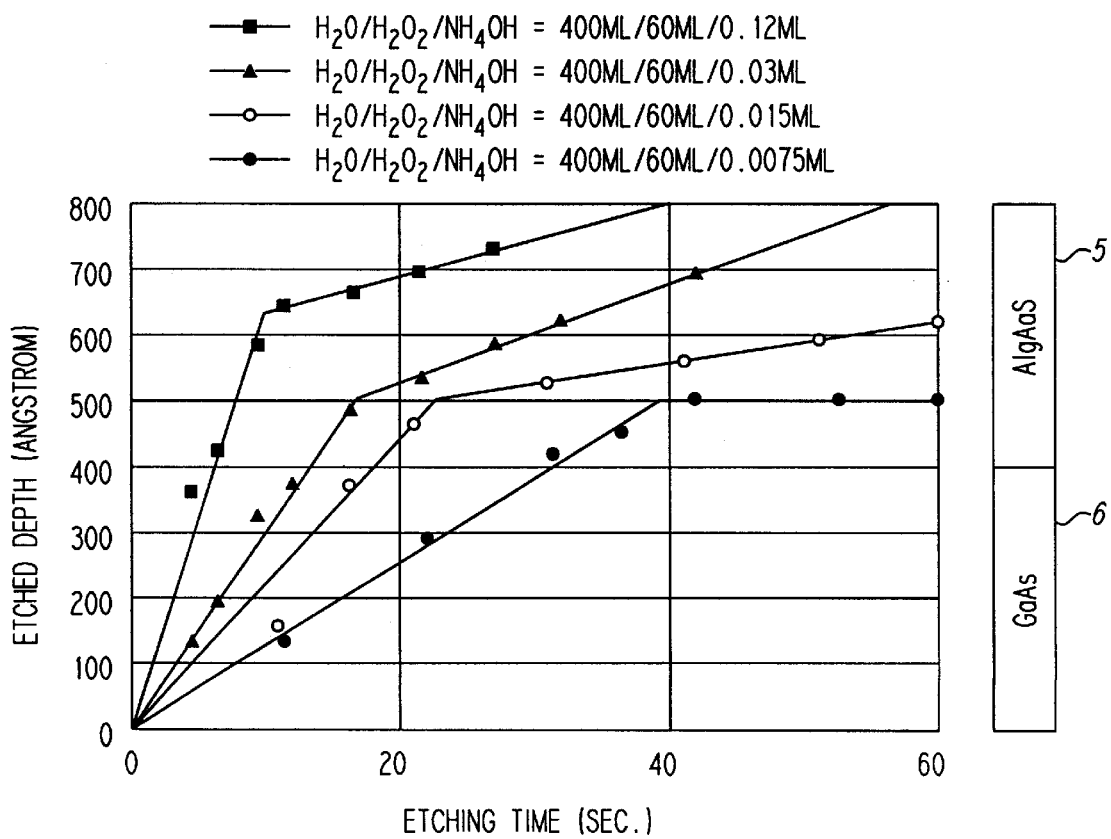
FIG. 13 is a graph showing etching capabilities of various etchants used in selectively etching GaAs and AlGaAs layers.

FIG. 13 is a graph showing etching capabilities of various etchants used in selectively etching GaAs and AlGaAs layers 6, 5.

The graph shown in FIG. 13 has a horizontal axis representing etching time and a vertical axis representing etched depth. Etchants used are mixtures of ammonia water (NH4OH) (containing 28% by weight of ammonia) and hydrogen peroxide solution (H2O2) (containing 30% by weight of hydrogen peroxide), the mixtures being diluted with water. When an etchant containing H2O, H2O2, and NH4OH at a ratio of 400 milliliters/60 milliliters/0.12 milliliter (H2O2/NH4OH=500) and an etchant containing H2O, H2O2, and NH4OH at a ratio of 400 milliliters/60 milliliters/0.03 milliliter (H2O2/NH4OH=2000) are used, the GaAs layer 6 and also the AlGaAs layers 5 are etched. When an etchant containing H2O, H2O2, and NH4OH at a ratio of 400 milliliters/60 milliliters/0.015 milliliter (H2O2/NH4OH=4000), only the GaAs layer 6 can selectively be etched by controlling the etching time. The etching time can easily be controlled so as not to etch the AlGaAs layers 5 by increasing the degree of dilution by water. The etching time control can further be facilitated by using an etchant containing H2O, H2O2, and NH4OH at a ratio of 400 milliliters/60 milliliters/0.0075 milliliter (H2O2/NH4OH=8000).

The selective etching data shown in FIG. 13 were obtained when the AlGaAs layer 6 where the mixed-crystal ratio of Al was 0.22 and the GaAs layer 5 were etched by the etchants with a pattern opening whose upper width was 0.3 mm and length was 1.5 mm, at an etching temperature of 23° C. with the etchants being not stirred.

Therefore, when an etchant containing a water-diluted mixture of ammonia water and hydrogen peroxide solution which are mixed with each other at a ratio of at least 1:4000, only the GaAs layer 6 deposited on the AlGaAs layer 5 can selectively be etched.

Since the same patterned electron-beam resist 8 is used as a mask in forming the recess 9 and the gate metal member 10, the gate metal member 10 and hence the gate electrode 15 are self-aligned with the recess 9.

Inasmuch as a surface-active agent is applied before the N+GaAs layer 6 is etched, an etchant can easily enter through the opening 8a into the opening 7a in the SiO2 film 7. Therefore, the N+GaAs layer 6 can sufficiently be etched by the applied etchant.

The recess 9 for accommodating a lower portion of the gate electrode 15 therein has a lower opening width of 0.1 mm which is substantially the same as the length of the gate electrode 15, and the exposed area of the AlGaAs layer 5 is substantially covered with the gate electrode 15. Consequently, the AlGaAs layer 5 which supplies carriers to the InGaAs layer 4 is not exposed outwardly, but protected and stabilized by the N+GaAs layer 6. As a result, the semiconductor device, i.e., the field-effect transistor, will generate reduced noise.

The N+GaAs layer 6 is etched into such a configuration that its contact layer remains closely to the channel underneath the gate electrode 15. The resistance between the channel and source and drain electrodes of the field-effect transistor is reduced, with the result that the mutual conductance of the field-effect transistor in a high-frequency range is increased. The field-effect transistor fabricated according to the method of the present invention is suitable for use especially in a high-frequency range from about 60 GHz to 100 GHz.

Although a certain preferred embodiment of the present invention has been shown and described in detail, it should be understood that various changes and modifications may be made therein without departing from the scope of the appended claims.

What is claimed is:

1. A method of fabricating a semiconductor device having a heterojunction structure between an AlGaAs layer and a GaAs layer disposed thereon, comprising the steps of:
    forming a resist having an opening which has a width of at most 0.5 mm on the GaAs layer;
    selectively etching only the GaAs layer through said opening with an etchant which comprises a mixture of ammonia water and hydrogen peroxide solution which are mixed at a ratio of at least 1:4000, said mixture being diluted with water, thereby to form a recess in said GaAs layer; and
    forming an electrode on the AlGaAs layer in said recess through said opening, using said resist as a mask.

2. A method according to claim 1, further comprising the step of:
    applying a surface-active agent before said GaAs layer is selectively etched, for thereby allowing the etchant to enter easily into said opening.

3. A method according to claim 1, wherein said mixture is diluted with at least about six times its volume of water.

4. A method according to claim 1, wherein said etchant comprises a mixture of ammonia water and hydrogen peroxide solution which are mixed at a ratio of at least 1:8000.

5. A method according to claim 1, wherein said opening has a width of about 0.1 mm.

6. A method of fabricating a high-frequency semiconductor device having a heterojunction between an AlGaAs layer having a thickness of about 300 angstroms and a GaAs layer disposed adjacent thereto, comprising the step of:
    selectively etching the GaAs layer with an etchant which comprises a mixture of ammonia water and hydrogen peroxide solution which are mixed at a ratio of at least 1:4000.

7. A method according to claim 6, wherein said mixture is diluted with at least about six times its volume of water.

8. A method according to claim 6, wherein said etchant comprises a mixture of ammonia water and hydrogen peroxide solution which are mixed at a ratio of at least 1:8000.

9. A method of fabricating a high-frequency semiconductor device having a heterojunction between an AlGaAs layer in which a mixed-crystal ratio of Al ranges from 0.2 to 0.3 and which has a thickness of about 300 angstroms and a GaAs layer disposed adjacent to the AlGaAs layer, comprising the step of:
    selectively etching only the GaAs layer with an etchant which comprises a mixture of ammonia water and hydrogen peroxide solution which are mixed at a ratio of at least 1:4000.

10. A method according to claim 9, wherein said mixture is diluted with at least about six times its volume of water.

11. A method according to claim 9, wherein said etchant comprises a mixture of ammonia water and hydrogen peroxide solution which are mixed at a ratio of at least 1:8000.

12. A method of fabricating a high-frequency semiconductor device having a heterojunction between an AlGaAs layer and a GaAs layer, comprising the step of:
    selectively etching only the GaAs layer with an etchant which comprises a mixture of ammonia water and hydrogen peroxide solution which are mixed at a ratio of at least 1:4000, said mixture being diluted with at least about six times its volume of water.

13. A method according to claim 12, wherein said etchant comprises a mixture of ammonia water and hydrogen peroxide solution which are mixed at a ratio of at least 1:8000.

14. A method of fabricating a semiconductor device having a heterojunction structure between an AlGaAs layer and a GaAs layer disposed thereon, comprising the step of:
    selectively etching only the GaAs layer with an etchant which comprises a mixture of ammonia water and hydrogen peroxide solution which are mixed at a ratio of at least 1:8000.

15. A method according to claim 14, wherein said mixture is diluted with at least about six times its volume of water.

* * * * *